United States Patent [19]

Street

[11] 4,279,472

[45] Jul. 21, 1981

[54] LASER SCANNING APPARATUS WITH BEAM POSITION CORRECTION

[76] Inventor: Graham S. B. Street, Impstone House, Pamber Rd., Silchester, Reading, RG7 2NU, England

[21] Appl. No.: 965,223

[22] Filed: Nov. 30, 1978

[30] Foreign Application Priority Data

Dec. 5, 1977 [GB] United Kingdom ............... 50603/77

[51] Int. Cl.³ .............................................. G01J 1/20
[52] U.S. Cl. ..................................... 250/201; 250/235
[58] Field of Search ............... 250/235, 234, 236, 201; 358/132, 302

[56] References Cited

U.S. PATENT DOCUMENTS

| 3,809,806 | 5/1974 | Walker et al. | 350/285 X |
| 4,002,830 | 1/1977 | Brown et al. | 350/6.7 X |
| 4,206,348 | 6/1980 | Davy et al. | 250/201 |

FOREIGN PATENT DOCUMENTS

1461169 1/1977 United Kingdom .

Primary Examiner—David C. Nelms
Assistant Examiner—Darwin R. Hostetter
Attorney, Agent, or Firm—Sughrue, Rothwell, Mion, Zinn and Macpeak

[57] ABSTRACT

This invention relates to a scanning apparatus in which a spot of light is swept or scanned over a receiving surface (11,27). The intensity of the spot may be modulated during scanning to build up a two-dimensional image on the receiving surface, or alternatively, the spot of light may be used to analyze the receiving surface to monitor its reflectivity or transmissivity. The scanning apparatus includes error detection means (13, 14, 15, 16, 20, 21, 43, 44, 45) to measure any error in the real or apparent position of the light source (1, 29), or the position of the receiving surface in a direction transverse to the scanning direction, an acousto-optic cell (4, 34) positioned in the light path between the light source and the receiving surface and arranged so that, in use, it causes the light beam from the light source to be deflected transverse to the scanning direction, and means (22, 23, 24, 25, 26) responsive to the error detection means to influence the deflection of the light beam in the acousto-optic cell to generate a deflection which compensates for any error in the real or apparent position of the light source or that of the receiving surface in the direction transverse to the scanning direction.

11 Claims, 6 Drawing Figures

LASER SCANNING APPARATUS WITH BEAM POSITION CORRECTION

This invention relates to a scanning apparatus in which a spot of light is swept or scanned over a receiving surface. The intensity of the spot of light may be modulated as it is swept or scanned over the receiving surface to build up a two-dimensional image on the receiving surface, or alternatively, the spot of light may be used to analyse the receiving surface in some way, for example to monitor its reflectivity or the transmissivity.

The spot of light is scanned over the receiving surface by real or apparent movement of a source of light or of the receiving surface, or of a combination of both of these. It is common to cause real or apparent movement of the source of light relative to the receiving surface in one direction and then move the receiving surface in another direction transverse to this one direction. The apparent movement between the source of light and the receiving surface may be generated, for example, by using a moving reflective surface. When the moving reflective surface is formed by a multifaceted mirror drum, the apparent movement between the receiving surface and the source of light occurs in a single direction but, if the moving reflective surface is formed by an oscillating mirror the relative apparent movement between the light source and the receiving surface is backwards and forwards in the one direction. It is also common for the receiving surface to be cylindrical and for it to be rotated about its axis whilst the source of light, or a reflective surface is moved parallel to the axis of the cylinder so that the spot of light scans a generally helical path over the outer surface of the cylinderical receiving surface.

To obtain an accurate scan, it is important that the relative location between the real or apparent position of the source of light and the receiving surface is maintained. Where there is movement in two transverse directions ideally each movement is uniform and regular and both movements are kept in strict synchronism with one another. With such an apparatus it is possible to obtain a very high scanning speed, particularly when the apparatus is arranged for apparent movement between the light source and the receiving surface. However, when the apparatus is arranged to scan at high speed, it is very difficult to ensure that the precise relative location between the real or apparent position of the light source and that of the receiving surface. Previous attempts to do this in the past have resulted in the scanning apparatus being very sophisticated and having to be built to a very high degree of accuracy. The apparatus has also had to be built very solidly and very rigidly to ensure that the various components are maintained in their required relative positions. These requirements have led to the scanning apparatus being very expensive and difficult to construct.

British Pat. No. 1,464,092 shows a scanning apparatus including a multi-faceted mirror drum and discusses the difficulties that exist in the manufacture of such a drum to a sufficiently high degree of accuracy. To overcome this, the specification proposed that the pyramid errors in a mirror drum are measured and then that a scanning apparatus includes an optical deflection arrangement. The optical deflection arrangement is controlled in synchronism with the angular position of the mirror drum and programmed so that a predetermined deflection is introduced by the optical deflection arrangement to compensate, in turn, for the pyramid errors in each facet of the mirror drum as it is rotated. This proposal clearly reduces the cost of the mirror drum but does not take any account of any errors in the mounting of the mirror drum nor any other errors occurring at any other point throughout the optical system. Thus, the remainder of the apparatus is still very expensive to construct since it has to be made to a very high degree of accuracy and tolerance.

According to this invention a scanning apparatus comprises a light source, a receiving surface, means to cause real or apparent movement of the light source relative to the receiving surface so that, in use, light from the light source is moved over the receiving surface in one direction, error detection means to measure any error in the real or apparent position of the light source, or the position of the receiving surface, in another direction transverse to the one direction, an acousto-optic cell positioned in the light path between the light source and the receiving surface and arranged so that, in use, it causes the light beam from the light source to be deflected in the other direction, and means responsive to the error detection means to influence the deflection of the light beam in the acousto-optic cell to generate a deflection which compensates for any error in the real or apparent position of the light source, or that of the receiving surface in the other direction.

Such an arrangement not only takes account of any regular, repetitive sources of error in the apparatus but also takes account of the constant or random errors and irregularities. Thus, in general, rather than using sophisticated and expensive high tolerance engineering to ensure that each component is initially in, and remains in, its required position, the present invention includes means to measure the amount of error in the position of the light source or the receiving surface, and an acousto-optic cell to cause apparent relative movement between them to compensate for any errors in position. The acousto-optic cell and the associated control devices are relatively inexpensive and thus an apparatus in accordance with this invention has great advantages from the cost point of view and results in a higher degree of accuracy in the positioning of the image of the light source on the receiving surface, and a greater lifetime of the apparatus.

This invention is particularly useful when it is used in conjunction with a scanning apparatus which already uses an acousto-optic cell. The acousto-optic cell may also be used to split the light beam into a number of different parts by applying an equal number of different deflections to the light beam in its passage through the cell. This splits the single beam of light into a number of different beams to form a number of different spots of light which, in turn, scan different paths on the receiving surface simultaneously. The acousto-optic cell may also be used to modulate the intensity of the light beam, or that of each of the light beams, so that, in use, the intensity of the light moving over the receiving surface is modulated.

An acousto-optic cell is formed by a block of transparent material having an acoustic transducer fixed to it. Ultrasonic acoustic waves generated by the transducer pass through the transparent material and cause a regular periodic change in its refractive index. This makes the transparent material act as a diffraction grating and the degree of deflection induced in a light beam passing through such a cell is dependent upon the frequency of the ultrasonic acoustic waves applied to the cell and the amount of light deflected is dependent upon the intensity of the ultrasonic acoustic waves applied to the cell. A typical frequency of operation for such a cell is 100 MHz. When the acousto-optic cell is used to split the beam into a number of different beams a family of acoustic waves each of different frequency are applied to the cell and when the cell also acts as a modulator the intensity of the individual waves are controlled independently of one another. When the acousto-optic cell splits the light beam into a number of different beams, the means responsive to the error detection means to influence the deflection of the light beam in the acousto-optic cell are arranged to shift the whole family of frequencies of acoustic waves applied to the acousto-optic cell to change the degree of deflection of each of the light beams and thereby compensate for errors whilst, at the same time, maintaining their mutual angular separation with respect to one another.

The light source may be formed by any substantially monochromatic light source but it is preferred that the light source is formed by a laser. The receiving surface may have a wide variety of forms depending upon the nature of the scanning apparatus with which this invention is concerned. Thus, the receiving surface may be formed by some light sensitive material, for example, light sensitive photographic film, light sensitive paper, a substrate coated with a light sensitive coating such as photoresist, or a xerographic material. Thus, as the beam of light is swept or scanned over such a receiving surface and its intensity is modulated, a direct or latent image is created on the receiving surface and when it is a latent image this can then be developed subsequently by, for example, developing a photographic film, developing and etching the surface of the substrate or by forming a print from the differentially charged surface of the xerographic material using conventional xerographic techniques. The receiving surface may not be light sensitive but may still be used with the beam of light having its intensity modulated for example, the receiving surface may be formed by a printing member substrate made from a plastics material. In such a case, the light source of the apparatus is preferably formed by a powerful laser and then, as the beam from such a source is scanned over the surface of the printing member substrate and as its intensity is modulated, the laser ablates the surface and engraves a two-dimensional image directly into the surface of the printing member substrate to provide an engraved printing member.

The scanning apparatus may also be arranged to monitor the reflectivity or transmissivity of the receiving surface, and in this case, the receiving surface is formed by for example, a photograph. As the spot or spots of light are scanned over the photograph the amount of light reflected from or transmitted through the photograph is monitored. In practice, when the transmissivity is measured a photographic negative or transparency is used as the receiving surface and this type of scanning apparatus is particularly important when scanning an image to provide information on variation on the image density over its surface.

Preferably the error detection means includes means to measure the real or apparent position of the light source, or that of the receiving surface, in the other direction; means to measure the position of the receiving surface, or the real or apparent position of the light source, in the one direction, means to establish the required real or apparent position of the light source, or that of the receiving surface, in the other direction from the position of the receiving surface, or the real or apparent position of the light source, respectively, in the one direction; and comparison means to compare the real or apparent position of the light source, or that of the receiving surface, in the other direction with the required real or apparent position of the light source, or that of the receiving surface, in the other direction and to provide an output indicative of any error between these two positions.

By measuring the position of the receiving surface, or the real or apparent position of the light source, in the one direction, and then using this information to obtain the required real or apparent position of the light source, or that of the receiving surface, in the other direction any irregularity in the movement and positioning of the receiving surface or of the light source in either the one, or the other direction is compensated for. Since the position of the receiving surface, or the real or apparent position of the light source in the one direction is used to determine the required position of the light source, or that of the receiving surface in the other direction there cannot be any error in the position of the receiving surface or of the light source in the one direction. The error detection means and the acousto-optic cell compensate for error in the other direction and, therefore the apparent position of the light source and the position of the receiving surface is correct in both directions. The relative movement between the light source and the receiving surface in the one direction may be created by a free running arrangement. Usually, the means to cause real or apparent movement of the light source relative to the image receiving surface in the one direction has considerable inertia and hence its movement is substantially uniform.

Preferably the error detection means measures the real or apparent position of the light source in the other direction relative to the position of the receiving surface in the other direction, so that, the acousto-optic cell compensates for any error in the relative real or apparent positions of the light source and the receiving surface. This is the ideal situation since the real or apparent position of the light source is then always related to that of the receiving surface and so any movements of the light source and the receiving surface are all taken into account and the receiving surface and the light source are always located correctly relative to one another irrespective of the absolute positions of either of them in space. In practice, frequently there are some parts of the apparatus which can be located precisely, for example, the receiving surface may be located exactly with respect to a main frame of the apparatus, and in this case it is only necessary to measure the relative positions of say the light source and the main frame of the machine, to obtain the required accuracy in positioning the light source and the receiving surface. Equally, if say, the receiving surface is movable with respect to the main frame it is also possible to establish the relative positions of say the light source and the receiving surface by comparing the positions of each of them with respect to the main frame.

As an example of the reduction of accuracy in the construction of scanning apparatus embodying the present invention assume that the positioning of the light spot or spots on the receiving surface must be within a tolerance of $\pm\delta$ then, using a conventional scanning apparatus the total cumulative error of all the components throughout the apparatus must not exceed this figure of ±δ. However, when the apparatus is made in accordance with this invention, the measuring means must be capable of measuring the cumulative error in the apparatus to within this degree of accuracy and then the acoustooptic cell must be capable of compensating this cumulative error. Clearly the acousto-optic cell must not have a sufficiently great error in itself that the ±δ tolerance is exceeded. Typically the accuracy of deflection that is obtained by an acousto-optic cell is related to its total range of deflection and is approximately a percentage of this total range of deflection. Typically, the error in the acousto-optic cell is 1% and in this case it is possible to compensate for tolerances and errors in the apparatus of 100×δ. With careful electronic design this may be increased to a factor of 500×δ. Assume that the final accuracy ±δ required is of the order of 1 micron and thus in existing apparatus, the total cumulative error must not be any greater than ±1 micron. However, when the apparatus is made in accordance with this invention, a cumulative error of a similar apparatus may be of the order of 0.1 mm or more and yet the final accuracy in the positioning of the light spot or spots is still within the required tolerance since this cumulative error is compensated for by the acousto-optic cell.

Two particular examples of apparatus in accordance with this invention will now be described with reference to the accompanying drawings, in which.

The first example of scanning apparatus in accordance with this invention forms the output stage of a high speed printer for printing alphanumeric characters. The high speed printer is typically used to provide a visual output of a computer.

Figure 1:
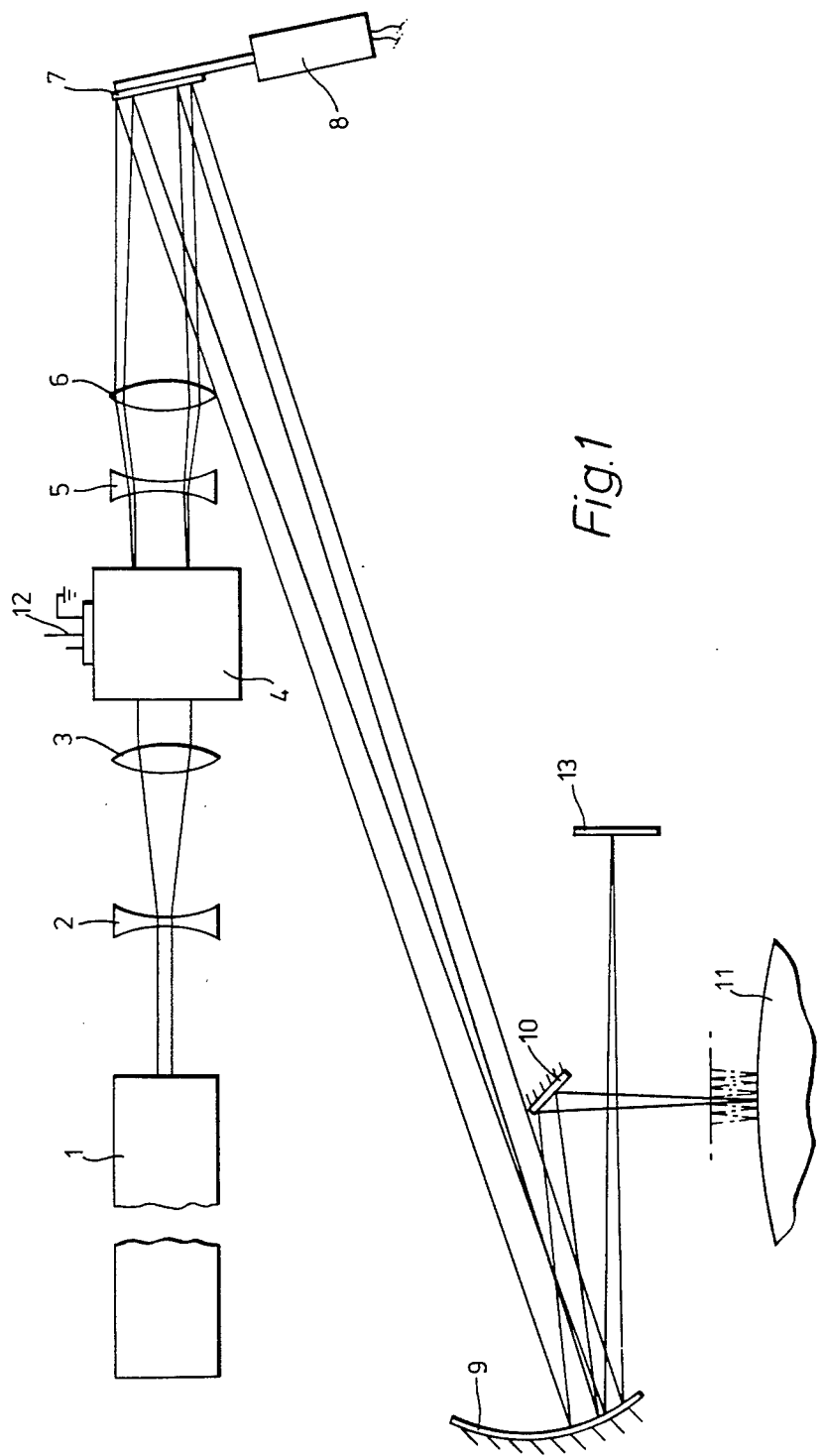
FIG. 1 is a schematic side elevation showing the optical path of the first example.
Figure 2:
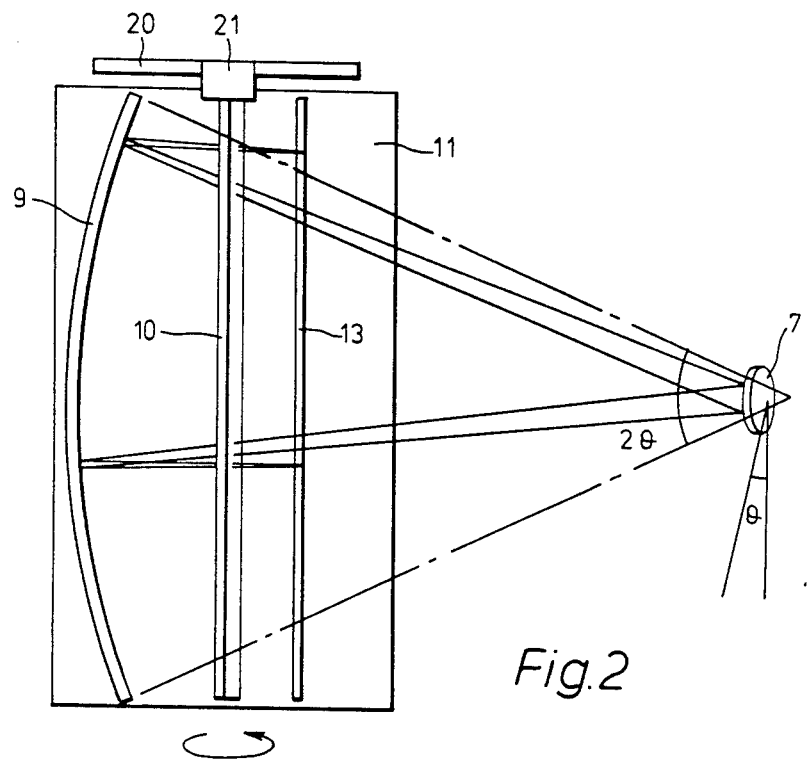
FIG. 2 is a schematic plan showing part of the optical path of the first example.

The optical path of the high speed printer is shown in FIGS. 1 and 2 and includes a light source 1 formed by a laser which, in this example is a Spectra Physics type 138 laser and the output beam is then expanded by passage through a lens combination formed by the diverging and converging lenses 2 and 3. The expanded laser beam then passes through an acousto-optic cell 4 and thence through a further diverging lens 5. A converging lens 6 concentrates the light beam onto an oscillating mirror 7. The mirror 7 is attached to an oscillating angular transducer 8 which is driven by a constant frequency oscillating electrical signal and the mirror and angular transducer combination may be formed by an oscillating galvanometer of type G 124 produced by General Scanning Incorporated. The light beam is reflected by the mirror 7 onto a curved field flattening mirror 9 and thence via an auxiliary inclined mirror 10 to the surface of a cylindrical image drum 11 made of xerographic material. The drum 11 forms part of a conventional xerographic printing station which will not be described in any further detail.

Figure 3:
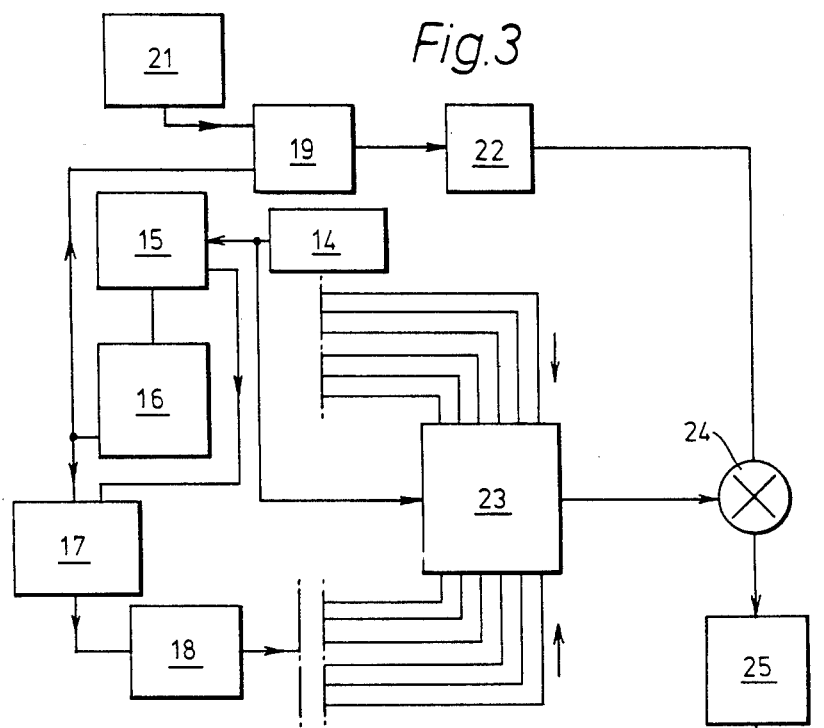
FIG. 3 is a block diagram of the electronic control circuit associated with the first and second examples.

In operation of this example, a family of six ultrasonic frequencies is applied via a co-axial cable 12 to the acousto-optic cell 4 by means to be described subsequently. This causes the light beam passing through the acousto-optic cell 4 to be split into seven different components, one component which passes through the cell without deviation and six other components which correspond one to each of the frequencies applied to the acousto-optic cell 4 and which are all deflected by different angular amounts. All seven light beams pass through the lenses 5 and 6 and are reflected from the mirror 7. In operation the mirror 7 oscillates with a rotary oscillating movement of θ degrees. This leads to the group of light beams between the mirror 7 and the mirror 9 moving through an angle of 2 θ. The group of beams impinge upon the field flattening curved mirror 9, and then they follow a linear path and oscillate in the up and down direction as seen in FIG. 2. Thus, as the light beam is scanned by the mirror 7, spots of light are scanned backwards and forwards in a direction parallel to the axis of the cylindrical xerographic drum 11. FIG. 1 shows the six independent beams of light only over the last part of travel to avoid confusion. The component of the light beam which is undiffracted in the acousto-optic cell 4 does not impinge upon the auxiliary mirror 10 but, instead, impinges on a ruled transmission grating 13. A further lens, not shown, collects the undeviated beam of light after passage through the grating 13 and concentrates it upon a photodetector 14 which is only shown in FIG. 3.

The undiffracted component of the light beam which is not deflected in the acousto-optic cell 4 forms a reference beam and is used to establish the instantaneous position of the scanning beam of light in a direction parallel to the axis of the drum 11. As the reference beam moves along the transmission grating 13 a series of pulses are produced from the output of the photodetector 14. The photodetector is connected to an up-down counter 15, shown in FIG. 3, and it is the output of this counter 15 which gives an indication of the instantaneous position of the beam of light in the scanning direction. Each time the light beam reverses its direction of travel the counter 15 emits an output pulse which is fed to a counter 16. The counter 16 generates an output signal representing the required position of the light beam in the direction transverse to the scanning direction. The output from a computer associated with the printer feeds information to a character store 17 to determine the characters and their order of printing. The outputs of the two counters 15 and 16 are also fed to the character store to provide address information on the writing position of the spots of light and to enable the character store to provide an output to a character generator 18 to determine the intensity of each of the spots of light required at that position to form the required character.

The output from the counter 16 is also fed to a digital comparator 19 as one of its inputs. The xerographic drum 11 includes some means to measure its position accurately, relative to the auxiliary mirror 10, for example a code wheel 20 with associated detector 21. This position detector, 21, provides information regarding the instantaneous real position of the surface of the xerographic drum 11 in a direction transverse to the scanning direction of the light spot and hence transverse to the axis of the cylindrical drum 11. The output of the detector 21 is supplied as the second input to the comparator 19. The comparator 19 compares the two inputs and produces an output proportional to the difference between its two inputs and which is indicative of any error in the position, in a transverse direction, of the family of light spots on the surface of the drum 11. This error in position may be caused by the movement of the drum not being in perfect synchronism with the scanning mirror or it may be due to any random vibration.

The output from the comparator 19 is converted to a variable frequency signal by a voltage controlled oscillator 22. The output from the character generator 18 is fed to a multiplexer unit 23 and a frequency generator, not shown, which generates a basic family of frequencies for each of the six different spots is also fed to the multiplexer unit 23. Gating pulses derived from the photodetector 14 and hence from the position of the beam of light in the direction of scanning are used to control the operation of the multiplexer unit 23. The output from the multiplexer unit 23 and the output from the voltage controlled oscillator 22 are fed to a multiplier 24 followed by a band pass filter 25, a power amplifier 26 and thence through the co-axial cable 12 to the acousto-optic cell 4.

The basic six frequencies that are fed to the multiplexer unit 23 are separated by 2 MHz intervals and centered around 50 MHz. The output from the voltage controlled oscillator 22 is typically within a range from 30 to 70 MHz and thus the output from the multiplier 24 has a low frequency component which is filtered out by the high band pass filter 25 and six high frequency components somewhere within a range from say 75 to 125 MHz. The family of six high frequency components move together as a group within this range of frequencies to vary the degree of deflection of the light beam by the acousto-optic cell 4 to compensate for errors between the instantaneous angular position of the drum 11 and the required position determined by the counter 16.

The provision of the acousto-optic cell 4 and the associated control circuitry enables the spots of light when scanned in both directions to be used for creating the image on the surface of the drum 11, i.e. whether the beams of light are moving upwards or downwards as seen in FIG. 2. Without any correction the light spots would move over a generally zig-zag path around the outer surface of the drum 11 and render it impossible to use both scanning directions. However, with the provision of the acousto-optic cell 4 and its associated control circuitry both directions of scanning are used since the light beams are deflected into their required positions and successive paths of the light spots on the surface of the drum are strictly parallel to one another with a strictly uniform spacing between them. Thus, the apparatus in accordance with this invention compensates for any errors in the positioning of the drum 11 whether they are due to vibrations or inaccuracies in the forward movement of the drum, or in the normal, uncorrected scanning path of the light beam over the drum.

The second example of a scanning apparatus in accordance with this invention is a scanning apparatus for use in the preparation of colour separation films used as intermediates in the preparation of printing plates. This second example uses the output from an image analysing scanner, or such a signal after it has been processed by a computer, to prepare the individual separation films.

Figure 4:
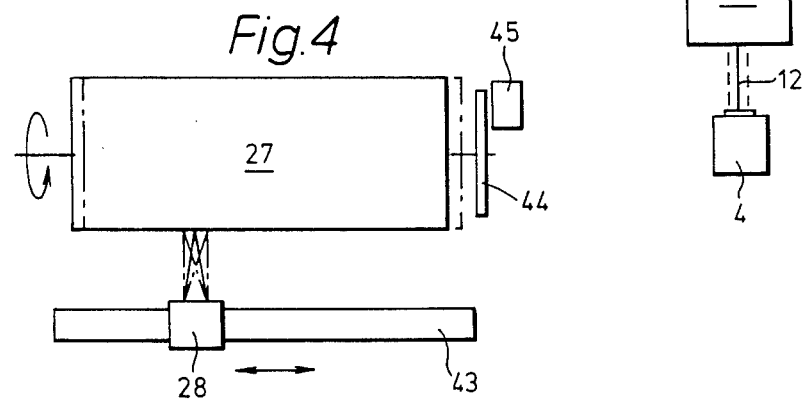
FIG. 4 is a diagrammatic plan view of the second example.

The receiving surface in this second example is typically a light sensitive film attached to the surface of a cylindrical drum. After receiving the latent image, the film is developed and used in the preparation of a printing member. The apparatus is shown very diagrammatically in FIG. 4 and includes a drum 27 arranged for rotation about its axis and a moving carriage 28 which carries the optical path of the apparatus and is arranged for movement parallel to the axis of the drum 27.

Figure 5:
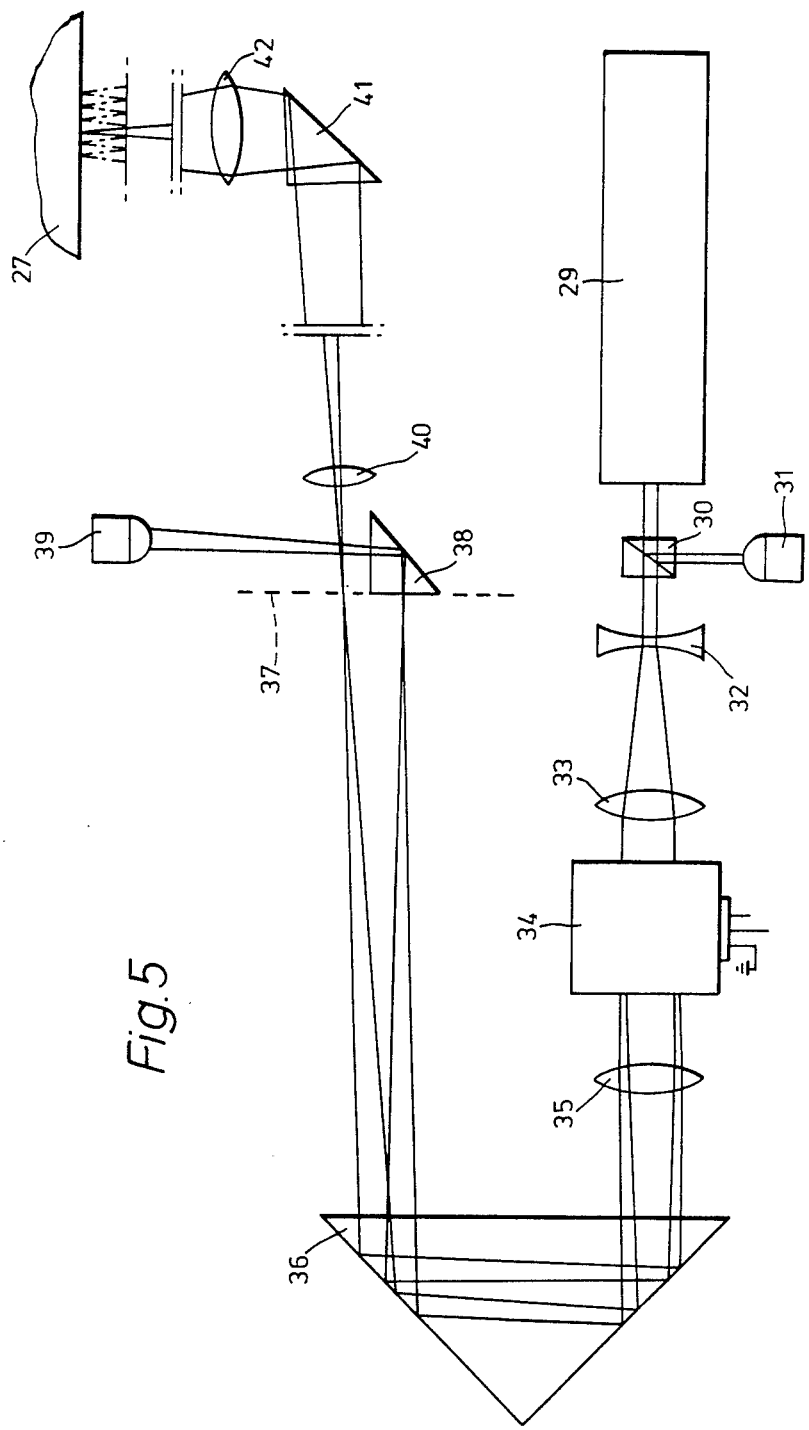
FIG. 5 is a diagram of the optical path of the second example.

The optical path of the apparatus is shown in FIG. 5 and it includes a laser 29, the output of which is fed through a beam splitter 30 which feeds a small fraction of the output of the laser to a photodetector 31 and to a pair of lenses 32 and 33 which expand the beam. The expanded beam is then applied to an acousto-optic cell 34 and thereafter to a converging lens 35. The direction of the beam is then reversed by a reversing prism 36. The beam of light is brought to a focus in a plane 37 which includes one face of a small prism 38.

In passage through the acousto-optic cell 34 the light beam is split into a deflected component containing six individual beams and an undeflected component similarly to the first example. The small prism 38 is arranged to deflect undeflected components of the laser beam onto a second photodetector 39. The deflected component of the light beam, i.e. all parts which are deflected on passage through the acousto-optic cell 34, pass through a field lens 40 and onto a prism 41. The prism 41 turns the beam so that it engages an imaging lens 42, by which the beams are focused on to the surface of the drum 27. Once again the family of six beams of light is only shown over the last part of their travel to avoid confusion. The focal length of the lens 42 is chosen to give the required image size on the surface of the drum 27.

All the components 29 to 42 are mounted on the transverse carriage 28 and the relative position of these various components is therefore generally fixed. It has been found that the position of the focusing lens 42 in the direction parallel to the axis of the drum 27 has an accurate relationship with the position of the spots of light on the surface of the drum 27 in that same direction, assuming that no deflection occurs in the cell 34. Accordingly, it has been found that, for the purposes of this example, provided that the position of the lens 42 is known with precision in the axial direction it is possible to use this position to represent the instantaneous position of where the beams of light would be assuming that the acousto-optic cell 34 is not operating. A transmission grating 43 is mounted on the main frame of the apparatus and the movable carriage 28 has a similar grating of identical spacing mounted beneath it and immediately above the grating 43. Light is passed through the two gratings and brought to a focus on a photodetector, not shown. As the movable carriage 28 moves axially with respect to the drum 27 and the ruled grating 43 the light passing through both gratings varies in intensity. Thus, the output of the photodetector associated with the gratings provides a series of pulses each one of which corresponds to the movement of the movable carriage by an amount equal to the spacing of the grating 43. The grating 43 and photodetector correspond to the code wheel 20 and detector 21 in the first example and provides an indication of the instantaneous position of the movable carriage 28 in the axial direction of the drum 27 and hence of the instantaneous position of where the spots of light would be in the axial direction of the drum if the acousto-optic cell 34 was not operating.

The drum 27 also includes a code wheel 44 with an associated detector 45. The code wheel 44 and the detector 45 correspond to the grating 13 and the detector 14 in the first example and the code wheel 44 and the detector 45 gives the instantaneous angular position of the drum 27 and hence the instantaneous position of the spots of light in the scanning direction. Circuitry exactly analogous to that described for the first example is arranged to compare the required position of the light spots in the axial direction of the drum 27 with their anticipated actual position and apply a compensating deflection via the acousto-optic cell 34 to compensate for any difference between these two positions.

The photodetector 31, which gives an output indicative of the initial intensity of the laser 29 and the photodetector 39, which gives an indication of the quantity of light which is undeviated in passage through the acousto-optic cell 34 are used to provide an indication of the amount of light from the initial light beam which is distributed amongst the family of six different light beams deflected in the acousto-optic cell 34. Control means are provided to vary the intensity of the ultrasonic frequencies applied to the acousto-optic cell in dependence upon the outputs of the photodetectors 26 and 34 to ensure that the absolute light intensity in any of the six light beams actuated at any instant is always substantially constant irrespective of the total number of beams actuated at any particular instant.

One error that may exist in scanning apparatus similar to this example is in the mounting of the drum 27. The drum 27 may be subject to end float, as shown exaggerated by the chain dotted lines in FIG. 4. If the drum moves in the direction of its axis clearly the position of the light beams with respect to the drum varies. This error can also be compensated for using an apparatus similar to the second example provided that the instantaneous position of the drum in the direction of its axis is known. One way of achieving this would be to determine the electrical capacity of coupling between the end face of the drum 27 and a component fixed to the machine frame and use the variation in capacitance between these two to give an indication of the position of the drum 27 relative to the machine frame. The position given by the position detector including the grating 43 can then be modified by the signal representing the axial position of the drum 27 to give an error signal indicative of the relative position between the drum 27 and the movable carriage 28.

A preferred way of achieving this however is to hold a reflective component in close proximity to the end face of the drum 27, for example on an air cushion or by some servo means, and then use this reflective component as part of an interferometer arrangement in which another part of the interferometer is mounted on the movable carriage 28. The interferometer arrangement is then arranged to measure the instantaneous position of the carriage 28 directly with relation to the position of the reflecting components, which in turn, is dependent upon the position of the end of the drum 27. Thus, with the apparatus arranged in this way, the instantaneous position of the movable carriage 28 would always be determined relative to the instantaneous position of the drum 27 rather than the frame of the machine and hence the error compensation applied to the acousto-optic cell 34 would correct errors in the relative position between the two.

Figure 6:
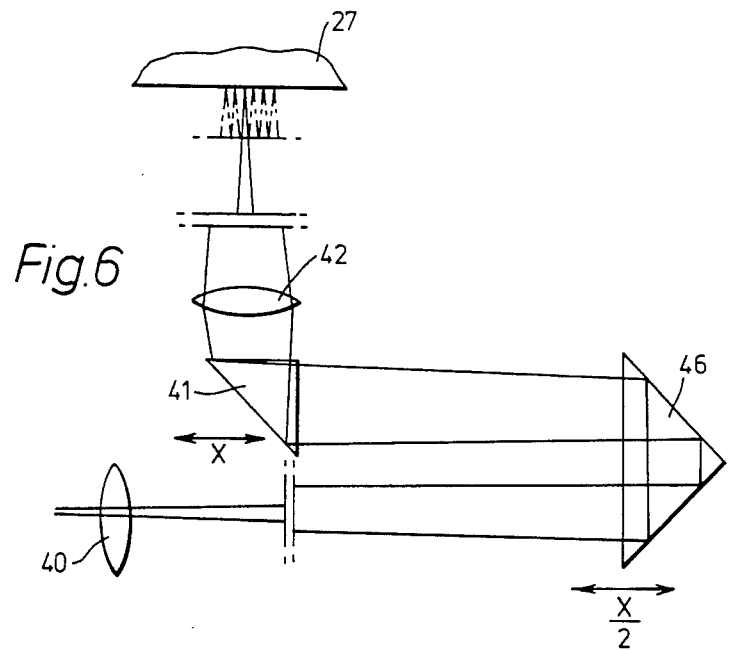
FIG. 6 shows a modification of the optical path of the second example.

Finally, all of the optical path shown in FIG. 5 need not necessarily be mounted on the movable carriage 28. FIG. 6 shows a modification of the apparatus in which the majority of the optical path up to and including the field lens 40, is fixed in position in relation to the main frame of the machine but the prism 41 and the lens 42 are still mounted on the movable carriage 28. In addition to the movable carriage 28 a secondary movable carriage is provided which is arranged to move at half the speed of the movable carriage 28 and this secondary movable carriage includes a reversing prism 46. As a further alternative an additional lens may be included in the system downstream from the lens 40 to provide a parallel output beam from the further lens and, with the apparatus modified in this way, no secondary movable carriage would be required.

I claim:

1. A scanning apparatus for generating a desired scan trace, comprising: a light source, a receiving surface, means for causing real or apparent movement of said light source relative to said receiving surface whereby a light beam from said light source is moved to scan a trace over said receiving surface in a scan direction, error detection means for continuously measuring one of said real or apparent position of said light source, and said position of said receiving surface, in a direction transverse to said scan direction and for comparing said position at each instant with the position required to provide the desired scan trace, an acousto-optic cell positioned in the light path between said light source and said receiving surface and arranged to cause said light beam from said light source to be deflected in said transverse direction, and means continuously responsive to said error detection means for influencing said deflection of said light beam in said acousto-optic cell to continuously generate a compensating deflection in said transverse direction so that the light impinges upon said receiving surface at each instant at the required point to generate the desired scan trace on the receiving surface.

2. The apparatus of claim 1, wherein said acousto-optic cell splits said light beam into a plurality of different parts by applying an equal plurality of different deflections to said light beam.

3. The apparatus of claim 1 or claim 2, wherein said acousto-optic cell modulates the intensity of said light beam or beams, whereby said intensity of said light beam or beams scanning over said receiving surface is modulated.

4. The apparatus of claim 1 wherein said light source is a laser.

5. The apparatus of claim 1, wherein said detection means measures one of said position of said receiving surface and said real or apparent position of said light source, in said scan direction, and establishes the required real or apparent position of one of said light source and said receiving surface, in said transverse direction from said position of said one of said receiving surface, and said real or apparent position of said light source, respectively, in said scan direction, and includes comparison means for comparing said one of said real or apparent position of said light source, and said position of said receiving surface in said transverse direction with said required real or apparent position of said one of said light source and said receiving surface, in said transverse direction, and for providing an output indicative of any difference between these said two positions.

6. The apparatus of claim 1 or claim 5, wherein said error detection means measures said real or apparent position of said light source in said transverse direction relative to said position of said receiving surface in said transverse direction, whereby said acousto-optic cell compensates for any error in the relative real or apparent positions of said light source and said receiving surface.

7. The apparatus of claim 5, wherein said receiving surface is a cylindrical xerographic drum, and wherein said means for causing said real or apparent movement of said light source relative to said receiving surface includes means for rotating said xerographic drum about its axis, and a mirror connected to an oscillating galvanometer, said mirror being arranged to cause apparent movement of said light source parallel to said axis of said drum, and said acousto-optic cell being arranged to cause apparent movement of said light source in a direction generally perpendicular to said axis of said drum.

8. The apparatus of claim 7, wherein said means for measuring said real or apparent position of said light source in said scan direction includes a position detector and means for generating a reference beam which is not influenced by said acousto-optic cell and for reflecting said reference beam off said mirror and onto said position detector, the output of said position detector providing an indication of said apparent position of said light source in said scan direction.

9. The apparatus of claim 5, wherein said receiving surface is in the form of a cylindrical drum, and wherein said means for causing real or apparent movement of said light source relative to said receiving surface includes means for rotating said cylindrical drum about its axis, and a movable carriage carrying one of said light source and means for deflecting said light beam from said light source, said movable carriage being movable in a direction parallel to said axis of said drum, whereby said light source appears to move in a helical path around the outer surface of said drum, said rotation of said drum causing said movement in said scan direction and said movement of said carriage causing said movement in said transverse direction.

10. The apparatus of claim 9, wherein said means for measuring said real or apparent position of said light source includes a position detector for identifying said position of said movable carriage in a direction parallel to the axis of said drum.

11. The apparatus of claim 8, or claim 10, wherein said position detector includes a grating and a photo-responsive detector arranged such that on movement of said reference beam or said movable carriage along said grating, light is transmitted through or reflected from, said grating to said photo-responsive detector, the output of said photo-responsive detector being formed by a series of pulses, each one of which corresponds to movement equal to the spacing of said grating, the number of pulses being used to give an indication of said position of said reference beam or said movable carriage.

* * * * *